US006170492B1

(12) United States Patent
Ueda et al.

(10) Patent No.: US 6,170,492 B1
(45) Date of Patent: Jan. 9, 2001

(54) CLEANING PROCESS END POINT DETERMINATION USING THROTTLE VALVE POSITION

(75) Inventors: Hiroyuki Ueda; Hirotaka Tanabe; Makoto Okubo, all of Narita (JP); Shankar Chandran, Milpitas; Ellie Yieh, Milbrae, both of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/097,411

(22) Filed: Jun. 15, 1998

(51) Int. Cl.[7] .............................. B08B 9/00; H01L 21/306
(52) U.S. Cl. .................... 134/1.1; 216/59; 438/5; 438/14; 438/905
(58) Field of Search ................. 134/1.1; 216/59; 438/905, 5, 14

(56) References Cited

U.S. PATENT DOCUMENTS

| 4,345,968 | * | 8/1982 | Coe ........................................ 216/59 |
| 4,362,596 | * | 12/1982 | Desilets et al. ....................... 216/59 |
| 4,695,700 | | 9/1987 | Provence et al. .................... 219/121 |
| 4,820,377 | * | 4/1989 | Davis et al. .......................... 134/1.1 |
| 5,643,364 | | 7/1997 | Zhao et al. ......................... 118/723 E |
| 5,653,894 | | 8/1997 | Ibbotson et al. ....................... 216/59 |
| 5,788,869 | * | 8/1998 | Dalton et al. ........................... 216/60 |
| 5,879,574 | * | 3/1999 | Sivaramakrishnan et al. ....... 134/1.1 |
| 5,902,403 | * | 5/1999 | Aitani et al. ........................... 118/723 |

FOREIGN PATENT DOCUMENTS 0 068 155 A2   1/1983   (EP) .

OTHER PUBLICATIONS

James P. Roland et al., "Endpoint Detection in Plasma Etching," J. vac. Sci. Technol. A3 (3), Jun. 1985, pp. 631–636.
International Search Report for PCT/US99/100391, Sep. 10, 1999, 7 pages.
U.S. application No. 08/682,861, Aitani et al., filed Jul. 12, 1996.

* cited by examiner

*Primary Examiner*—Randy Gulakowski
*Assistant Examiner*—Saeed Chaudhry
(74) *Attorney, Agent, or Firm*—Thomason, Moser & Patterson

(57) ABSTRACT

The present invention provides a method and apparatus for detecting the end point of a process by monitoring the position of a valve during the process. In one aspect, a cleaning process is performed in the chamber, and a controller monitors the valve position to determine the end point of the process which corresponds to a decrease in the number of steps in the valve position required to achieve a stable throttle valve position after the cleaning process is complete.

9 Claims, 3 Drawing Sheets

CLEANING PROCESS END POINT DETERMINATION USING THROTTLE VALVE POSITION

BACKGROUND OF THE INVENTION

1. Field of the Invention

The present invention relates generally to semiconductor processing. More particularly, the present invention relates to a method for determining the endpoint of a process performed within a processing chamber.

2. Background of the Related Art

In the field of integrated circuit and flat panel display fabrication, multiple deposition and etching processes are performed in sequence on the substrate within one or more processing chambers to form various design structures. Processes such as physical vapor deposition (PVD), chemical vapor deposition (CVD), etching, etc. are well known in the industry and each result in residue build up in the chamber. For example, during CVD, silicon oxide or silicon nitride materials are deposited on all exposed surfaces in the CVD deposition chamber, as well as on the substrate. Such residues, which may accumulate to a thickness of as much as 0.5 to 10 microns, usually must be removed from the chamber surfaces prior to the next deposition process. Otherwise, the material may flake off and deposit on a substrate, thereby compromising the integrity of features formed thereon.

Conventionally, chambers are cleaned to remove the residue using a plasma and select chemical compounds which react with the residue and form a volatile compound which can be exhausted from the chamber. Alternatively or additionally, the chemical compounds may form etching species which bombard the chamber surfaces to dislodge residue from the chamber components.

When the chamber cleaning operation is performed, the production of semiconductor devices can not continue. As a result, the effective productivity of the chamber, as measured by substrate throughput, decreases significantly. In order to increase the chamber productivity, it is necessary to quickly finish the cleaning operation and restart the production promptly after the end of the cleaning operation. Therefore, it is imperative to precisely determine the endpoint of the cleaning process.

One method of detecting the end point of the cleaning process monitors a variation in a prescribed light wavelength emitted by the plasma. However, it is difficult to correctly detect the end point of the cleaning operation using this method because light emitted from lamps used to heat the substrate also heats, reacts with or otherwise affects the wavelength monitor, distorting the wavelength reading and resulting in over-cleaning or under-cleaning.

Another method of detecting the endpoint of a cleaning process was to observe the conditions within the chamber through a quartz view port. During processing within the chamber, residue accumulates on the view port, thereby blocking the view into the chamber. As the cleaning process is performed, the material is removed from the view port and all the other surfaces in the chamber as well, until the view port is cleaned and line of sight into the chamber is restored. Once line of sight into the chamber has been restored, the process is continued for approximately 20 to 30 seconds to ensure that the cleaning process is complete. The line of sight detection method does not provide an accurate determination of the endpoint and requires additional insurance cleaning time to assure adequate cleaning of the chamber.

In the area of integrated circuit fabrication, time spent in processing and cleaning is an important issue which manufacturers monitor. Time spent cleaning the chamber can be a limiting factor in the capabilities of their production. Accordingly, there is a need for an accurate and consistent determination of the endpoint of a process performed in a chamber. Preferably, the determination can be made using existing hardware and monitors.

SUMMARY OF THE INVENTION

The invention generally provides a method for detecting the end point of a process by monitoring the position of a valve during the process. In one aspect, a cleaning process is performed in the chamber, and a controller monitors the throttle valve position to determine the end point of the cleaning process which corresponds to a change in the number of steps in the valve position required to achieve a stable throttle valve position after the cleaning process is complete.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
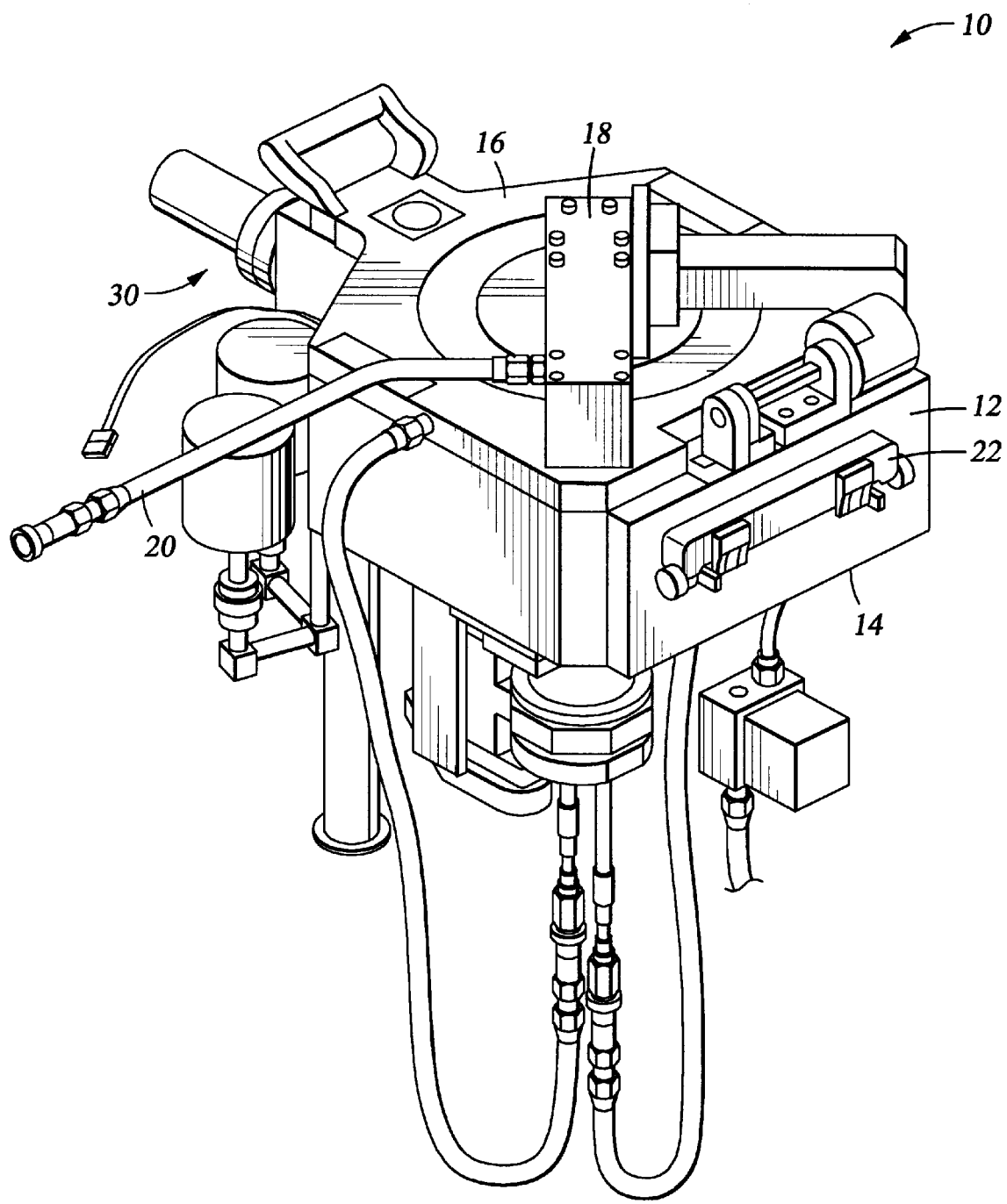
FIG. 1 is a substantially top perspective view of a deposition chamber 10 of the invention.

FIG. 1 is a substantially top perspective view of a deposition chamber 10 of the invention. One chamber which can benefit from the advantages of the invention is the Giga-Fill CxZ Chamber, available from Applied Materials, Inc., located in Santa Clara, Calif. The chamber 10 typically includes a side wall 12, a bottom 14 and a lid 16 which delivers the processing gases into the chamber. The lid 16 is typically hingedly mounted on top of the chamber to allow opening and closing of the lid 16 and forms a vacuum seal with the sidewall 12 when closed. A gas distribution system 18 is generally mounted on the lid 16 and connected to a remote plasma generator 116 (shown in FIG. 2) that is connected to a gas supply 118 (shown in FIG. 2) through a gas line 20 to deliver the processing gases into the chamber 10. Processing gases are typically delivered through a showerhead arrangement or gas distributor 55 (shown in FIG. 2) disposed in the central portion of the lid 16. A slit valve 22 is typically disposed on a side wall 12 to allow transfer of substrates or wafers into and out of the processing chamber 10. A pressure control system 30 is connected to a side wall 12 to adjust the pressure within the chamber 10 for various processing needs. The pressure control system 30 preferably comprises a throttle valve 32, a foreline isolation valve 34 and a capacitance manometer 36 (as shown in FIGS. 2 and 3).

Figure 2:
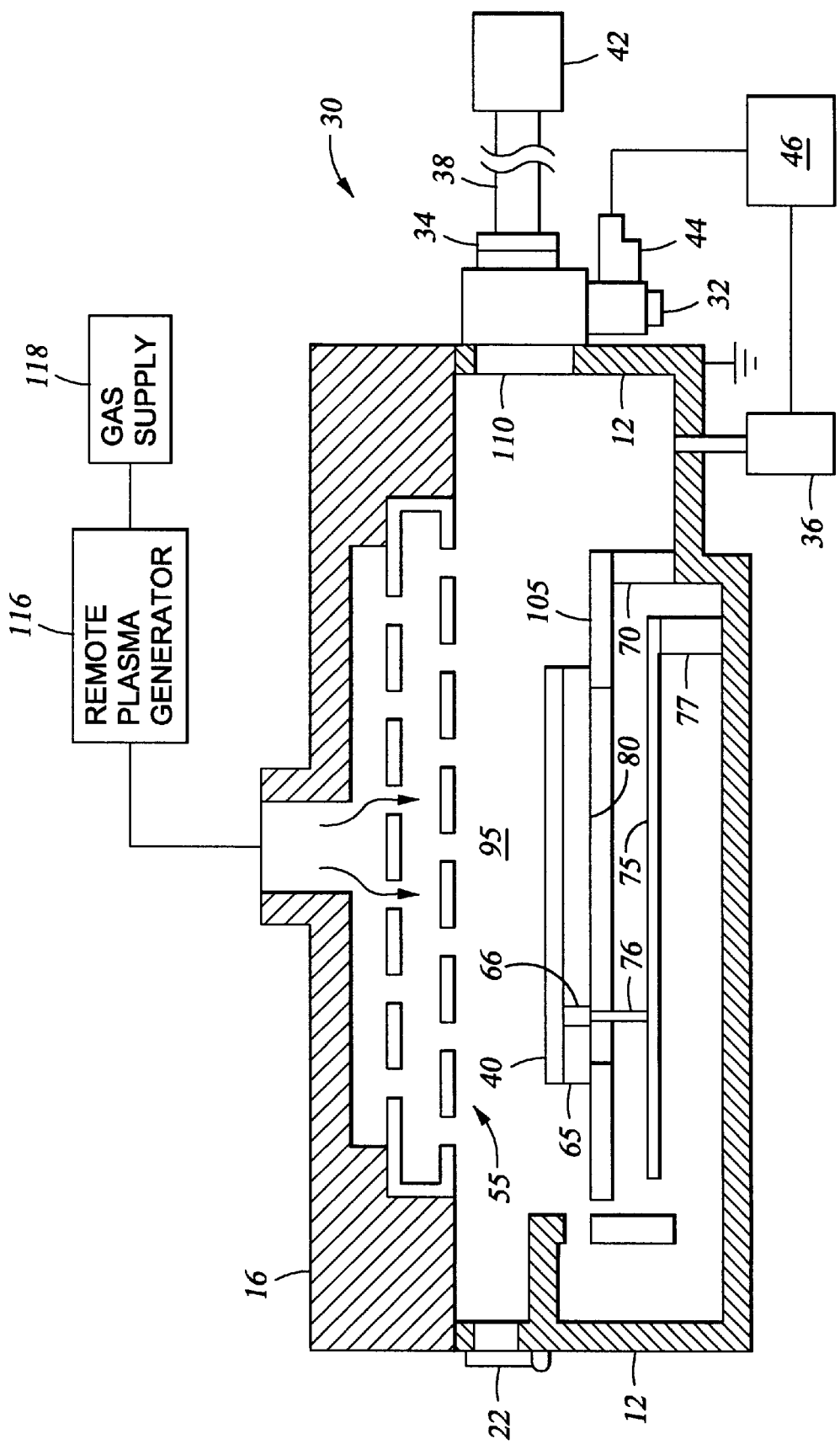
FIG. 2 is a simplified cross sectional schematic view of a deposition chamber 10 of the invention.

FIG. 2 is a simplified cross sectional view of a deposition chamber 10 of the invention. As shown in FIG. 2, a process gas distributor 55 for distributing and delivering process gases into the chamber is typically disposed within the lid 16 and positioned directly above a substrate 40. The gas distribution system also typically includes mass flow controllers (not shown) and air operated valves (not shown) to control the flow of process gases into the deposition chamber 10. Preferably, separate gas supplies are connected to the gas distribution system for processing and cleaning.

A substrate support 65 is provided for supporting the substrate 40 in the deposition chamber 10. The substrate 40 is introduced into the chamber 10 through a slit valve 22 on the side wall 12 of the chamber 10 and placed on the substrate support 65. The substrate support 65 is disposed on a support lift assembly 105 that includes a support lift actuator 70 to adjust the gap between the substrate 20 and the gas distributor 55. To facilitate transport of the substrate 40 into and out of the chamber 10, a lift finger assembly 75 comprising a plurality of lift fingers 76 that move through bores 66 in the substrate support 65 lifts and lowers the substrate 40 onto the substrate support 65. A thermal heater 80 disposed within the substrate support 65 is provided to rapidly heat the substrate 40 to a desired processing temperature. Rapid heating and cooling of the substrate is preferred to increase processing throughput, and to allow rapid cycling between successive processes operated at different temperatures within the same chamber 10. The substrate 40 is processed in a process zone 95 between the substrate support 65 and the gas distributor 55. Preferably, a remote microwave plasma generator 116 connected to a gas supply 118 is provided to generate a plasma and deliver reactive gas species into the process zone 95 of the chamber 10 during substrate processing as well as chamber cleaning. Once the wafer processing is completed, the substrate is transported out of the chamber 10 through slit valve 22, and the cleaning process can be performed. Generally, the chamber cleaning process comprises introducing a plasma of one or more cleaning gases into the chamber through the remote plasma generator 116 and exhausting the byproducts of the cleaning gases and the contaminants out of the chamber.

Figure 3:
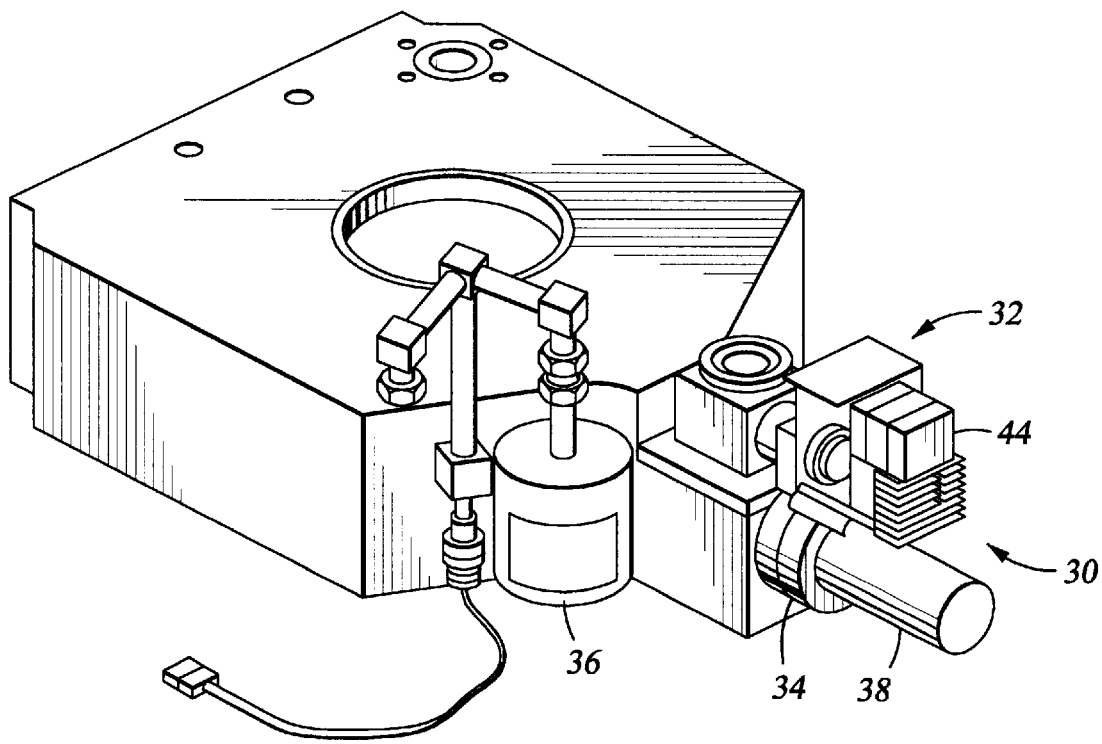
FIG. 3 is a partial bottom perspective view of a deposition chamber 10 of the invention.

FIG. 3 is a partial bottom perspective view of a deposition chamber 10 of the invention. Referring to FIGS. 2 and 3, a pressure control system 30 is connected to a side wall 12 through an exhaust passage 110 to monitor and adjust the pressure within the chamber 10 for various processing needs. The pressure control system 30 preferably comprises a throttle valve 32, a foreline isolation valve 34 and a capacitance manometer 36 (a chamber pressure detector). Preferably, the throttle valve 32 is a dual spring throttle valve driven by a stepper motor 44 to regulate the exhaust rate of the gas within the chamber, and the throttle valve 32 includes a sleeve having a Teflon-coated interior and a rotating drum or a butterfly valve inside. A vacuum pump 42, such as a rotary vane vacuum pump, is connected to the pressure control system 30 through a vacuum conduit 38 to evacuate chamber gases. Typically, the vacuum pump 42 is capable of achieving a minimum vacuum of about 10 mTorr and is usually mounted on a remote pump frame (not shown) to provide the vacuum required to pump down the processing chamber.

Chamber pressure is typically maintained during processing in a vacuum range. As one example, the chamber pressure is preferably maintained at about 1.5 torr during the cleaning process in this chamber. A controller 46, such as a microprocessor, is connected to the pressure control system 30 to regulate the throttle valve 32 that controls the exhaust rate of the gas from the process chamber 10. Typically during chamber cleaning, the throttle valve 32 is initially open to a wide position to allow contaminants to be pumped out of the chamber with the cleaning gas while maintaining the required pressure in the chamber. As the chamber 10 reaches a clean state where fewer particles are being removed from the interior surfaces of the chamber, the stepper motor 44 gradually closes the throttle valve 32 to maintain the same chamber pressure throughout the cleaning process. The stepper motor 44 is electrically connected to and controlled by the controller 46 which receives a signal from the capacitance manometer 36 that detects the chamber pressure.

Figure 4:
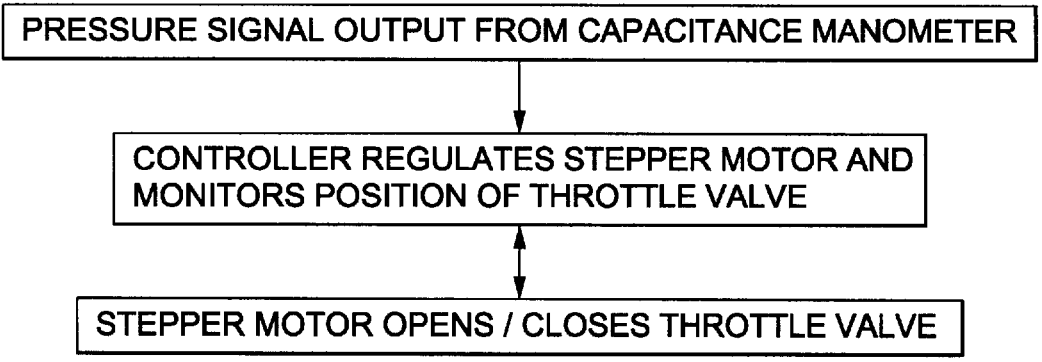
FIG. 4 is a flow chart illustrating the signal flow to and from a controller of the invention.

FIG. 4 is a flow chart illustrating the signal flow to and from a controller of the invention. Adjustment of the pressure in processing chamber 10 is performed by opening/closing the throttle valve 32 through increasing/decreasing steps of the stepper motor 44, respectively. Control of the pressure in chamber 10 is performed by first transferring the signal corresponding to the chamber pressure output from a pressure detector, such as the capacitance manometer 36, to an input to controller 46. The controller 46 then sends signals to the stepper motor 44 to control the open/close state or position of throttle valve 32, and the pressure in chamber 10 is controlled at a constant pressure to stabilize the plasma throughout the cleaning operation. The controller 46 also monitors the position of the throttle valve 32 to determine the endpoint of the process according to the invention.

The cleaning operation in the deposition chamber 10 is discussed below using a tungsten cleaning process as an example of the gas composition at the end point of the cleaning operation and the associated throttle valve adjustments to maintain consistent chamber pressure and determine the end point of the cleaning process. In the cleaning operation of tungsten (W), a cleaning gas, preferably nitrogen trifluoride ($NF_3$), is supplied to the chamber 10 through the gas distribution system 18 at a selected flow rate, preferably between about 100 sccm and about 2000 sccm, even more preferably at about 950 sccm. During cleaning, the remote microwave plasma generator 116 generates a plasma of the cleaning gas ($NF_3$) in the chamber 10. Typically, the remote microwave plasma generator 116 is operated at between about 1500 W to about 3000 W, and preferably between about 2000 W and 2500 W. In this case, tungsten deposited on the interior chamber surfaces and other components within the processing chamber 10 react with fluorine (F) generated in the $NF_3$ plasma to form tungsten hexafluoride ($WF_6$). As the reaction proceeds, the pressure in chamber 10 increases until cleaning saturation. To maintain the same chamber pressure, the throttle valve 32 gradually opens wider (i.e., in increasing steps for the stepper valve) to provide a higher exhaust rate to relieve the increasing pressure within the chamber 10 until the cleaning process is saturated. The reaction between tungsten and fluorine continues until all of the residual tungsten reacts with fluorine, and the cleaning operation comes to an end. After cleaning saturation, the throttle valve 32 gradually closes (i.e., in decreasing steps for the stepper valve) to decrease the exhaust rate due to decreasing pressure in the chamber.

The invention provides a controller that monitors the throttle valve position to determine the end point of the cleaning process which corresponds to a decrease in the number of steps in the valve position required to achieve a stable throttle valve position after the cleaning process is complete. Typically, the throttle valve position can be determined using the existing hardware and software set up for the controller of the pressure control system to an accuracy of about 800 steps where 0 represents a completely closed throttle and 800 represents a completely open throttle. Through experimentation, a calibrated set of data can be compiled for each deposition process and the corresponding cleaning process to determine the throttle valve position corresponding to the end point of the cleaning process. Once the data has been compiled for a particular cleaning process, the controller is then able to determine the end point of the cleaning process for all subsequent runs of the cleaning process by monitoring the throttle valve position. As the cleaning process progresses, the controller monitors the throttle valve position, and ends the cleaning process when the throttle valve position matches the calibrated end point throttle position.

When a fluorine-type gas is used as the cleaning gas, the chamber pressure will increase during the cleaning process until cleaning saturation and decrease after the end point of the cleaning operation. When the cleaning gas reaction typically causes a net molar production of gas, the end point of the reaction is typically indicated by a drop in the chamber pressure. However, it is within the scope of the present invention that even when the end point is indicated by a pressure rise, the end point can be correctly determined by the throttle valve position.

Although the invention is described using a cleaning process to remove tungsten, the invention contemplates cleaning processes for various other contaminants and residual deposits within the chamber. Particularly, the invention contemplates residual films from the deposition of undoped silica glass (USG), boron silica glass (BSG), phosphorous silica glass (PSG) and boron phosphorous silica glass (BPSG). In addition to nitrogen trifluoride and other fluorine based cleaning gases, the invention contemplates various cleaning gases including argon, nitrogen, oxygen, helium and other compounds, as well as combinations of these gases with flourine based cleaning gases.

While the foregoing is directed to the preferred embodiment of the present invention, other and further embodiments of the invention may be devised without departing from the basis scope thereof, and the scope thereof is determined by the claims that follow.

We claim:

1. A method of determining an endpoint of a process in a chamber having an exhaust valve connected to a controller, comprising:

a) monitoring a position of a valve regulating a gas outlet of the chamber; and b) comparing the valve position with a calibrated end point valve position.

2. The method of claim 1 wherein the valve is a throttle valve operated by a stepper motor.

3. The method of claim 2 wherein the process is a cleaning process.

4. The method of claim 3, further comprising:

c) providing one or more cleaning gases into the chamber while monitoring the position of the valve.

5. The method of claim 4 wherein the one or more cleaning gases are provided from a remote plasma generator.

6. The method of claim 4 wherein the one or more cleaning gases comprises one or more gases selected from the group consisting of fluorine, argon, nitrogen, oxygen, helium and combinations thereof.

7. The method of claim 4 wherein the one or more cleaning gases comprises nitrogen trifluoride ($NF_3$).

8. The method of claim 4 wherein the one or more cleaning gases are provided at between about 100 sccm and about 2000 sccm into the chamber.

9. The method of claim 4 wherein the one or more cleaning gases are provided at about 950 sccm into the chamber.

* * * * *

UNITED STATES PATENT AND TRADEMARK OFFICE
CERTIFICATE OF CORRECTION

PATENT NO. : 6,170,492 B1
DATED : January 9, 2001
INVENTOR(S) : Ueda et al.

It is certified that error appears in the above-identified patent and that said Letters Patent is hereby corrected as shown below:

<u>Title page,</u>
OTHER PUBLICATIONS, please insert "May/" before "June. 1985, pp. 631-636"

Signed and Sealed this

Fifth Day of February, 2002

*Attest:*

JAMES E. ROGAN
*Attesting Officer*   *Director of the United States Patent and Trademark Office*

UNITED STATES PATENT AND TRADEMARK OFFICE
CERTIFICATE OF CORRECTION

PATENT NO.    : 6,170,492 B1
DATED         : January 9, 2001
INVENTOR(S)   : Ueda et al.

It is certified that error appears in the above-identified patent and that said Letters Patent is hereby corrected as shown below:

<u>Title page,</u>
Item [56], OTHER PUBLICATIONS, please insert -- May / -- before "June. 1985, pp. 631-636".

Signed and Sealed this

Twenty-first Day of January, 2003

JAMES E. ROGAN
*Director of the United States Patent and Trademark Office*